(12) United States Patent
Cohen et al.

(10) Patent No.: US 12,349,497 B2
(45) Date of Patent: Jul. 1, 2025

(54) PATTERN TRANSFER PRINTING OF MULTI-LAYERED FEATURES

(71) Applicant: WUHAN DR LASER TECHNOLOGY CORP., LTD, Wuhan (CN)

(72) Inventors: Eyal Cohen, Kfar-Saba (IL); Moshe Finarov, Rehovot (IL)

(73) Assignee: Wuhan DR Laser Technology Corp,. LTD, Wuhan (CN)

( * ) Notice: Subject to any disclaimer, the term of this patent is extended or adjusted under 35 U.S.C. 154(b) by 279 days.

(21) Appl. No.: 17/562,360

(22) Filed: Dec. 27, 2021

(65) Prior Publication Data

US 2023/0207720 A1    Jun. 29, 2023

(51) Int. Cl.
*H10F 71/00* (2025.01)
*B41M 5/50* (2006.01)
(Continued)

(52) U.S. Cl.
CPC ............. *H10F 71/00* (2025.01); *B41M 5/502* (2013.01); *H05K 3/007* (2013.01); *H10F 77/211* (2025.01); *H05K 2203/0113* (2013.01)

(58) Field of Classification Search
CPC ............ H01L 31/022425; H01L 31/18; H05K 2203/0113; H05K 3/007; H05K 2203/107;
(Continued)

(56) References Cited

U.S. PATENT DOCUMENTS 7,767,489 B2    8/2010    Kwon et al.
9,616,524 B2    4/2017    Matusovsky et al.
(Continued)

FOREIGN PATENT DOCUMENTS

CN    106457299    2/2017
CN    113130672    7/2021
(Continued)

OTHER PUBLICATIONS

J. Lossen, Pattern Transfer Printing (PTP™) for c—Si solar cell metallization, 5th Workshop on Metallization for Crystalline Silicon Solar Cells, Energy Procedia 67 ( 2015 ) 156-162, ScienceDirect, Elsevier.
(Continued)

*Primary Examiner* — Philip C Tucker
*Assistant Examiner* — Jimmy R Smith, Jr.
(74) *Attorney, Agent, or Firm* — PEARL COHEN ZEDEK LATZER BARATZ LLP

(57) ABSTRACT

Pattern transfer sheets and methods are provided, providing multi-layer paste stack lines that are printed on a receiving substrate in a single illumination step. The paste is filled layer-by-layer, possibly having different materials in different layers, with layer thickness controlled by parameters of the filling elements, e.g., in case of blades, the pressure, angle, velocity and flexibility (material) of the blade. Specifically, a bottom layer of the stack may be configured to interface the receiving substrate while one or more top layers may be configured to optimize the quality of the printed features. For example, bottom layers may comprise to bind to the substrate, to modify the substrate (e.g., forming selective emitter (SE) therein) and/or provide a barrier from top layer(s) which may not be compatible with the substrate (e.g., copper on silicon). Releasing material may be used to support the single step release of the stack line.

8 Claims, 8 Drawing Sheets
(1 of 8 Drawing Sheet(s) Filed in Color)

(51) Int. Cl.
   *H05K 3/00* (2006.01)
   *H10F 77/20* (2025.01)
(58) Field of Classification Search
   CPC .......... H05K 3/027; H05K 3/046; H05K 3/20;
         H05K 3/04; B41M 5/502; B23K 26/361;
         B29C 64/147; B29C 64/268; B32B 15/04;
         B33Y 10/00; B33Y 30/00
   See application file for complete search history.

(56) References Cited

U.S. PATENT DOCUMENTS

| | | | |
|---|---|---|---|
| 9,750,141 | B2 | 8/2017 | Noy |
| 10,973,129 | B2 | 4/2021 | Landa et al. |
| 2004/0110321 | A1 | 6/2004 | Oda et al. |
| 2017/0013724 | A1* | 1/2017 | Noy ............ H05K 3/1258 |
| 2019/0019736 | A1* | 1/2019 | Schrauben ......... H05K 3/046 |
| 2020/0211729 | A1* | 7/2020 | Chandrasekaran ............ H01L 31/022425 |
| 2021/0136923 | A1 | 5/2021 | Landa et al. |

FOREIGN PATENT DOCUMENTS

| | | |
|---|---|---|
| CN | 216069167 U | 3/2022 |
| CN | 115489196 | 12/2022 |
| CN | 116001465 | 4/2023 |
| EP | 2660352 | 11/2013 |
| JP | H0716935 | 7/1995 |
| WO | WO 2009/143792 | 12/2009 |
| WO | WO 2009/153792 | 12/2009 |
| WO | WO 2018/020479 | 2/2018 |
| WO | WO 2018/020481 | 2/2018 |
| WO | WO 2018/020483 | 2/2018 |

OTHER PUBLICATIONS

A. Rohatgi, Self-Aligned Self-Doping Selective Emitter for Screen-Printed Silicon Solar Cells, 2001.

M. Galiazzo et al; Double Printing of Front Contact Ag In c—Si Solar Cells; Jan. 2010 https://www.researchgate.net/publication/268030316.

Jan Lossen; Double printing nPERT cells with narrow contact layers; ScienceDirect; Energy Procedia 92 ( 2016 ) 939-948; 6th International Conference on Silicon Photovoltaics, SiliconPV 2016.

Heraeus; Front Side Double-Print Paste; 2019; https://www.heraeus.com/media/media/hpt/doc_hpt/metallization_pastes_downloads/Spotlight_SOL9662_B_EN_V05.

* cited by examiner

200

210 Filling trenches that are arranged in a pattern on a source substrate, with printing paste composed of several stacked layers

212 Filling the trenches with different pastes of different thickness until full filling of the trenches in the source substrate

220 Releasing the printing paste from the trenches onto a receiving substrate - printing the whole stack line using a single illumination step by a laser beam

225 Optionally applying a releasing layer to facilitate full stack printing

230 — Prior to the filling, coating the trenches internally with a releasing layer material and drying the releasing layer material to form a solid coating of the trenches configured to disintegrate upon illumination – to facilitate release of the stack line of paste layers filled within the coated trenches

232 — Optionally, cleaning a surface of the pattern transfer sheet between the trenches from coating residues

210 — Filling trenches that are arranged in a pattern on a source substrate, with printing paste composed of several stacked layers

212 — Filling the trenches with different pastes of different thickness until full filling of the trenches in the source substrate

220 — Releasing the printing paste from the trenches onto a receiving substrate - printing the whole stack line using a single illumination step by a laser beam

240 — After printing, cleaning the receiving substrate by removing disintegration products of the coating therefrom

*Figure 4B*

PATTERN TRANSFER PRINTING OF MULTI-LAYERED FEATURES

1. TECHNICAL FIELD

The present invention relates to the field of transfer printing, and more particularly, to printing multi-layered features.

2. DISCUSSION OF RELATED ART

U.S. Pat. No. 9,616,524, which is incorporated herein by reference in its entirety, teaches a method of depositing a material on a receiving substrate, the method comprising: providing a source substrate having a back surface and a front surface, the back surface carrying at least one piece of coating material; providing a receiving substrate positioned adjacent to the source substrate and facing the coating material; and radiating light towards the front surface of the source substrate, to remove at least one piece of the coating material from the source substrate and deposit said removed at least one piece onto the receiving substrate as a whole.

Lossen et al. (2015), Pattern Transfer Printing (PTP™) for c-Si solar cell metallization, $5^{th}$ Workshop on Metallization for Crystalline Silicon Solar Cells, Energy Procedia 67:156-162, which is incorporated herein by reference in its entirety, teaches pattern transfer printing (PTP™) as a non-contact printing technology for advanced front side metallization of c-Si PV solar cells, which is based on laser-induced deposition from a polymer substrate.

SUMMARY OF THE INVENTION

The following is a simplified summary providing an initial understanding of the invention. The summary does not necessarily identify key elements nor be used to limit the scope of the invention, but merely serves as an introduction to the following description.

One aspect of the present invention provides a pattern transfer sheet comprising: a plurality of trenches on a source substrate, the trenches arranged in a pattern and configured to be filled with printing paste and to enable releasing the printing paste from the trenches onto a receiving substrate upon illumination by a laser beam, wherein the printing paste comprises a stack made of a plurality of layers, that is to be transferred as a stack line onto the receiving substrate using a single illumination step.

One aspect of the present invention provides a pattern transfer method comprising: filling, layer-by-layer, a stack made of a plurality of printing paste layers into a plurality of trenches on a source substrate, wherein the trenches are arranged in a pattern, and releasing, using a single illumination step, the stack from the trenches onto a receiving substrate through illumination by a laser beam.

These, additional, and/or other aspects and/or advantages of the present invention are set forth in the detailed description which follows; inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout. This application file contains at least one drawing executed in color. Copies of the color drawing(s) will be provided by the Office upon request and payment of the necessary fee.

In the accompanying drawings:

FIGS. 4A and 4B are high-level flowchart illustrating pattern transfer methods, according to some embodiments of the invention.

DETAILED DESCRIPTION OF THE INVENTION

Figure 1:
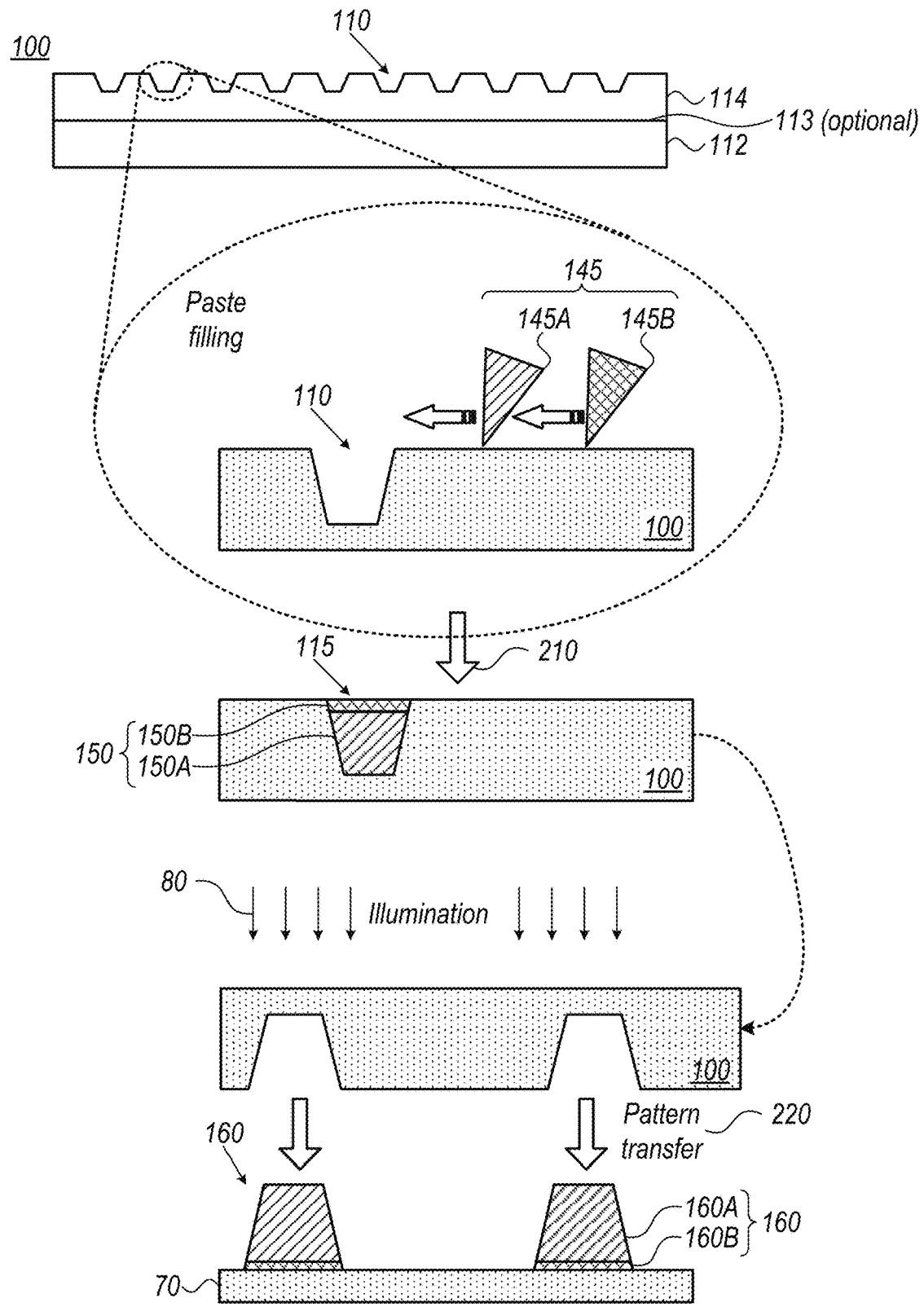
FIGS. 1, 2A and 2B are high-level schematic illustrations of pattern transfer sheets with multi-layered stacks of printing paste and pattern transfer methods, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Embodiments of the present invention provide efficient and economical methods and mechanisms for producing multi-layered features using transfer printing processes and thereby provide improvements to the technological field of producing electric circuits. Pattern transfer sheets and methods are provided, providing multi-layer paste stacks that are printed on a receiving substrate in a single illumination step. The paste is filled layer-by-layer, possibly having different materials in different layers, with layer thickness controlled by parameters of the filling elements, e.g., in case of blades, the pressure, angle, velocity and flexibility (material) of the blade. Specifically, a bottom layer of the stack may be configured to interface the receiving substrate while one or more top layers may be configured to optimize the quality of the printed features. For example, bottom layers may be configured to bind to the substrate (e.g., mechanically and/or electrically), to modify the substrate (e.g., forming selective emitter (SE) therein) and/or provide a barrier from top layer(s) which may not be compatible with the substrate (e.g., copper on silicon). Releasing material may be used to support the single step release of the stack. Advantageously, disclosed pattern transfer sheets and methods enable printing multi-layered conductive lines on PV cells as well as printing multi-layered bumps on PCB, printing resistors and capacitors and other printed electronics devices.

Figure 2A:
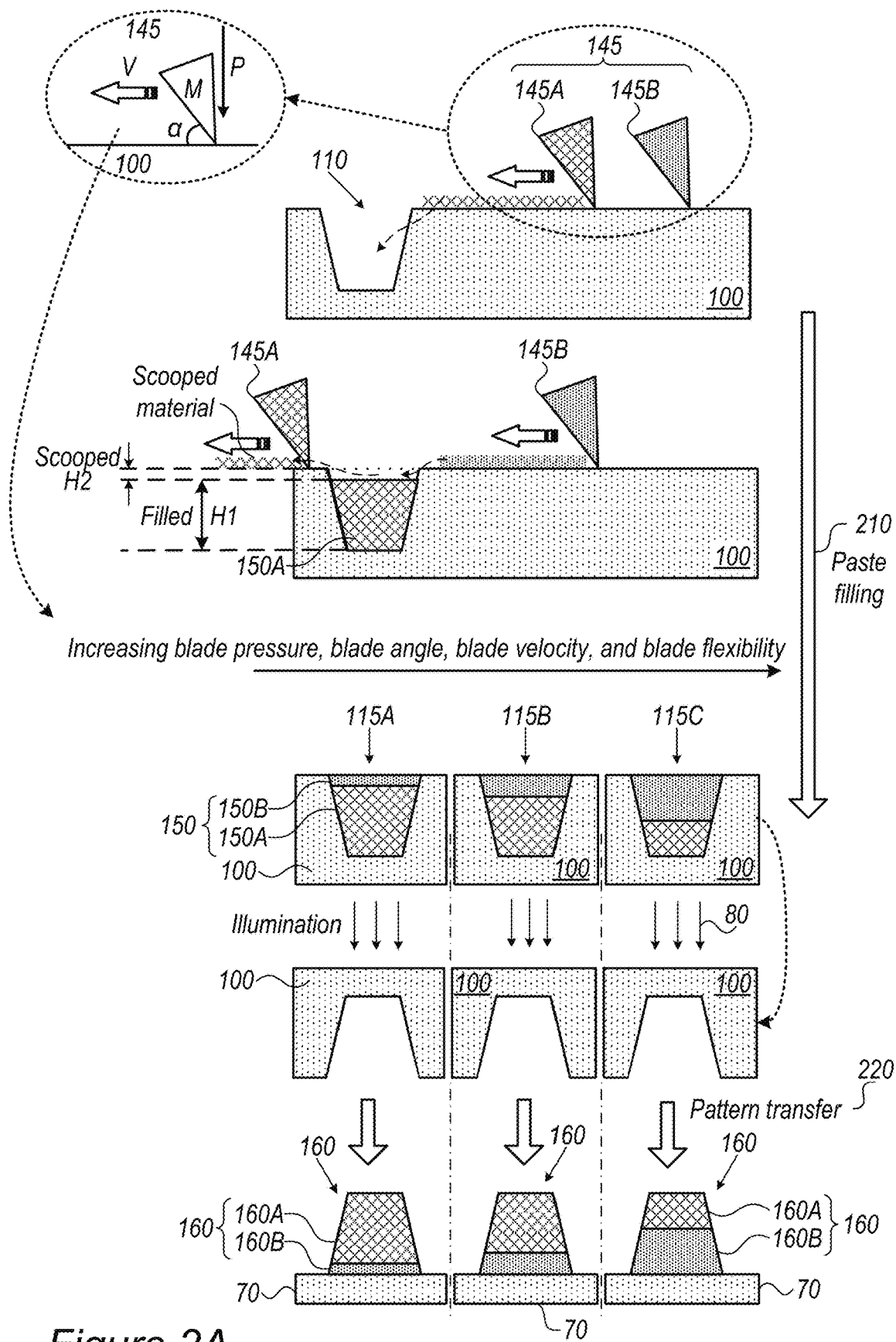
Figure 2B:
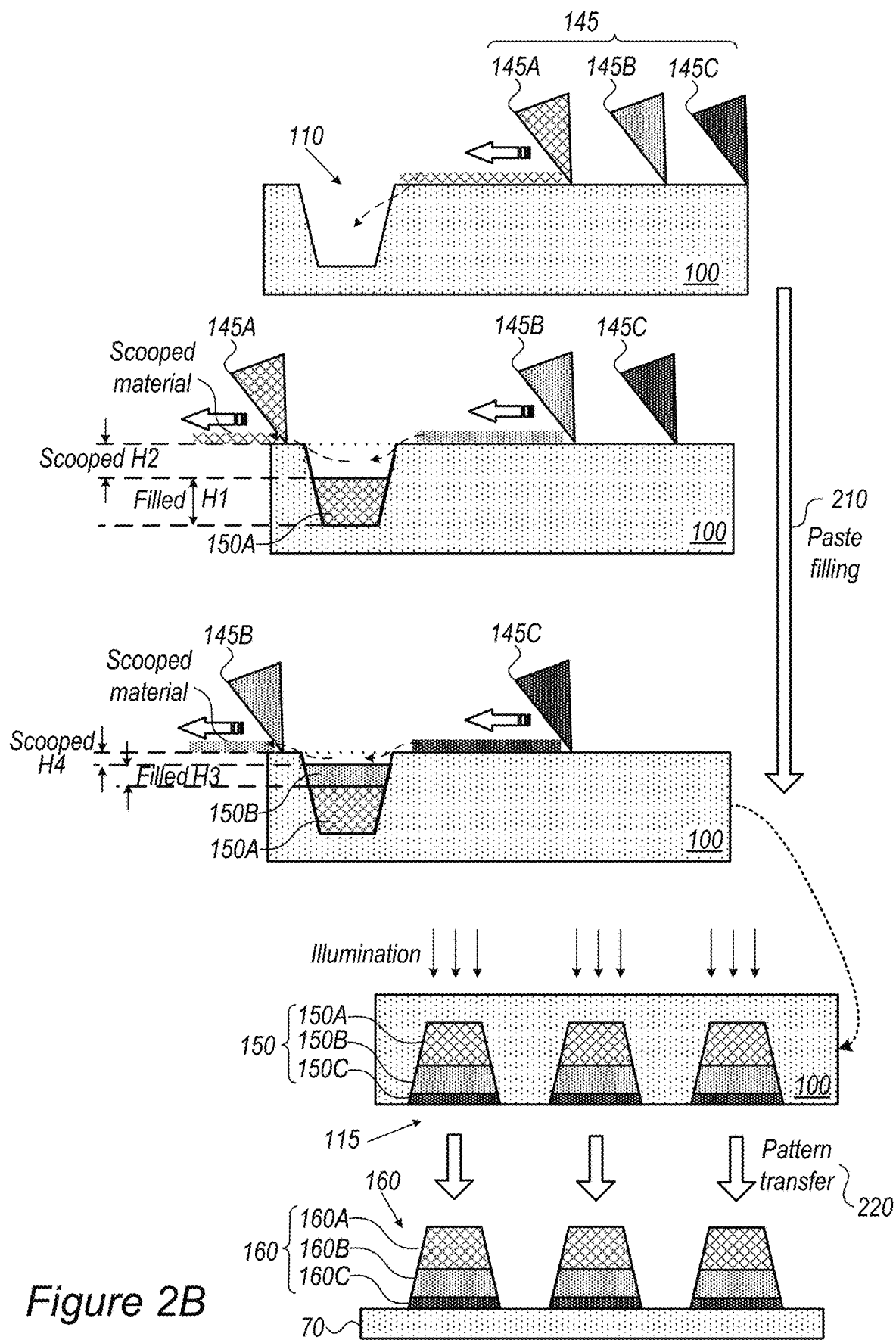

FIGS. 1, 2A and 2B are high-level schematic illustrations of pattern transfer sheet 100 with a multi-layered stack 150 of printing paste and pattern transfer methods 200, according to some embodiments of the invention. FIG. 1 illustrates schematically the paste filling and pattern transfer processes, while FIG. 2A illustrates schematically process parameter adjustments for printing multi-layered stack 150 and FIG. 2B illustrates schematically printing multi-layered stack 150 as a stack line with more than two layers. It is noted that for clarity reasons, only two layers 150A, 150B are illustrated explicitly; disclosed embodiments however are not limited to two layers, and in various embodiments multi-layered stack 150 may comprise 3, 4, 5 or more layers, prepared and printed according to the principles disclosed herein. While some of the illustrations include for clarity a single trench 110 per sheet 100, clearly any of the disclosed embodiments is applicable to sheets 100 with multiple trenches 110 arranged in specified patterns on sheet 100.

Pattern transfer sheet 100 comprises a plurality of trenches 110 arranged in a specified pattern (pattern not shown and may be of any configuration). Trenches 110 are configured to be filled with printing paste and consecutively enable and support releasing the printing paste from trenches 110 onto a receiving substrate 70 upon illumination by a laser beam 80. Pattern transfer sheet 100 comprises a source substrate that may be flexible (e.g., a polymer sheet) or rigid (e.g., a glass substrate). The supporting portion of the pattern transfer sheet 100 may be a stretchable substrate with certain stretching properties such as a polymer substrate, or the supporting portion of the pattern transfer sheet 100 may be a rigid substrate such as a glass substrate.

The printing paste comprises multi-layered stack 150 made of a plurality of layers (150A, 150B, and so forth) that is filled 210 into trenches 110 by one or more heads 145 to yield filled trenches 115, and is transferred as a stack line onto receiving substrate 70 using a single illumination (pattern transfer) step 220. Filling the printing paste into trenches 110 (stage denoted 210 may be carried out in a consecutive manner, layer-by-layer—as illustrated schematically.

In the illustrated non-limiting example, two layers 150 of printing paste are filled into trenches 110 consecutively, with a first paste material filled as layer 150A into trenches 110, e.g., using a doctor blade filling head 145A with controlled scooping and removing of paste from the top part of trenches 110, e.g., carried out by blade 145A of the same head or alternatively by an additional moving blade (not illustrated). The depth of scooping maybe controlled, e.g., by the scooping blade material, blade angle, head pressure and head movement velocity. A second paste material may be filled on top of layer 150A as layer 150B, filling the remaining volume of trenches 110 to yield filled trenches 115 in case of two-layered implementations. Filling layer 150B with the second paste material using a doctor blade filling head 145B (followed by minimal or no scooping).

Consecutive patter transfer 220 using illumination 80 of pattern transfer sheet 100 from the back side thereof releases stack line 150 of the multi-layered paste from filled trenches 115 onto substrate 70 (e.g., wafer 70) in a single stage (illustrated in FIG. 1 schematically, with sheet 100 facing down for releasing the paste)—to yield multi-layered elements 160 such as elements in electronics design, lines, fingers or bumps, made of layers 160B, 160A of the second and first materials, in opposite order. Second paste layer 150B becomes bottom layer 160B contacting receiving substrate 70, while first paste layer 150A becomes top layer 160A of feature 160. It is noted that while inner layer 150A typically contacts most of the surface area of trenches 110 in source substrate 100, bottom layer 160B typically provides the interface between feature 160 (formed from transferred stack line 150) and receiving substrate 70.

In various embodiments, more than two layers may be filled 240 in to trenches 110 and consecutively transfers, using single stage 250, onto receiving substrate 70 to yield multi-layered features. For example, three, four, five or more layers may be part of multi-layered stack line 150—yielding multi-layered elements 160. In certain embodiments, the thickness of bottom layer 150A may be between 1-5 μm. Top layer 150B may be several μm thick, e.g., within any of the ranges 3-5 μm, 4-5 μm, 4-7 μm, 5-10 μm, over 7 μm, or any subranges thereof.

It is noted that any of heads 145 may comprise a recirculating paste dispensing head as described in Chinese Patent Applications Nos. 202110673006.5 and 202121350578.1, incorporated herein by reference in their entirety. For example, heads 145 which are used to scoop an upper portion of the filled material (see, e.g., in following FIGS. 2A, 2B) may comprise doctor blades configured to provide the required scooping, while head 145 filling the last layer (without scooping) may be a recirculating paste dispensing head.

FIG. 2A further illustrates schematically various ways to control the thickness of the layers in stack 150 and consequently in feature 160, according to some embodiments of the invention. For example, layer thickness may be controlled by any of the pressure apply by blades 145, the angle of blades 145, the velocity of blades 145 and/or the material blades 145 are made of. Specifically, the thickness of applied layer (denoted schematically H1, e.g., layer 150A) decreases with higher blade pressure, with larger blade angle, with higher blade velocity and with softer blade material—leaving more volume to be filled by consecutive layer(s) 150B (the volume thickness denoted schematically H2). As illustrated schematically in FIG. 1, the transfer of stack line 150 onto substrate 70 is carried out by illumination applied to the back of sheet 100, placed directly above and in close proximity to substrate 70.

In the illustrated examples, increasing blade pressure (P) of blade 145A filling in layer 150A from P=2.5 bar to P=3.5 bar (while keeping the blade pressure of blade 145B filling in layer 150B at 2 bar) reduced the thickness of layer 150A, leaving more volume to form thicker top layer 150B (illustrated schematically as filled trenches 115A and 115B for lower and higher blade pressure, respectively). Correspondingly, in deposited features layer bottom 160A became thicker and top layer 160B became thinner as the filling blade pressure was increased. The reduction in thickness of layer 150A with increased blade pressure was found to result from enhanced scooping with higher blade pressures, e.g., using Heraeus™ 9651B paste, P=2.5 barblade pressure of blade 145A removed about 1 μm of the filled paste (115A, leaving 1 μm for layer 150B) while P=3.5 bar blade pressure of blade 145A removed about 4 μm of the filled paste (115B, leaving 4 μm for layer 150B). It is noted that the lower pressure of blade 145B yields a thin and minimally-scooped layer 150B on top of layer 150A.

In the illustrated examples, increasing blade angle (α) of blade 145A filling in layer 150A from α=30° to α=120° (under blade pressure of P=2.5 bar, while keeping the blade pressure of blade 145B filling in layer 150B at 2 bar and its angle at α=30°) reduced the thickness of layer 150A, leaving more volume to form thicker top layer 150B (illustrated schematically as filled trenches 115A and 115B for lower and higher blade angles, respectively). Correspondingly, in deposited features layer bottom 160B became thicker and top layer 160A became thinner as the filling blade angle was increased. The reduction in thickness of layer 150A with increased blade angle was found to result from enhanced scooping with higher blade angles, e.g., using Heraeus™ 9651B paste, α=30° blade angle of blade 145A removed about 1 μm of the filled paste (115A, leaving 1 μm for layer 150B) while α=120° blade angle of blade 145A removed about 4 μm of the filled paste (115B, leaving 4 μm for layer 150B). It is noted that the lower angle of blade 145B yields a thin and minimally-scooped layer 150B on top of layer 150A.

In the illustrated examples, increasing blade velocity (V) of blade 145A filling in layer 150A from V=25 mm/sec to V=100 mm/sec (under blade pressure of P=2.5 bar and blades' angle of α=30° while keeping the blade pressure of blade 145B filling in layer 150B at 2 bar) reduced the thickness of layer 150A, leaving more volume to form thicker top layer 150B (illustrated schematically as filled trenches 115A and 115B for lower and higher blade velocity, respectively). Correspondingly, in deposited features layer bottom 160B became thicker and top layer 160A became thinner as the filling blade velocity was increased. The reduction in thickness of layer 150A with increased blade velocity was found to result from enhanced scooping with higher blade velocities, e.g., using Heraeus™ 9651B paste, V=25 mm/sec blade velocity of blade 145A removed practically none of the filled paste (115A, leaving a minimal volume for layer 150B) while V=100 mm/sec blade velocity of blade 145A removed 3-4 μm of the filled paste (115B, leaving 3-4 μm for layer 150B). It is noted that the lower velocity of blade 145B yields a thin and minimally-scooped layer 150B on top of layer 150A. Intermediate values of the blade velocity yield intermediate values of the scooping.

In the illustrated examples, increasing blade material flexibility (M) of blade 145A filling in layer 150A from standard metal (e.g., stainless steel) blades 145A over plastic (e.g., polyester or ultra-high molecular weight polyethylene—UHMWPE) blades 145A to rubber blades 145A (under the same blade pressure, blade angle and blade velocity) reduced the thickness of layer 150A, leaving more volume to form thicker top layer 150B (illustrated schematically as filled trenches 115A and 115B for medium and high blade flexibility, respectively). Correspondingly, in deposited features layer bottom 160B became thicker and top layer 160A became thinner as the filling blade flexibility was increased.

The reduction in thickness of layer 150A with increased blade flexibility was found to result from enhanced scooping with higher blade flexibility, e.g., using Heraeus™ 9651B paste, metal blade 145A removed practically none of the filled paste (115A, leaving a minimal volume for layer 150B), plastic blade 145A removed 3-4 μm of the filled paste (115B, leaving 3-4 μm for layer 150B) and rubber blade 145A removed 6-8 μm of the filled paste (filled trench 115C, leaving 6-8 μm for layer 150B). It is noted that the lower flexibility of blade 145B yields a thin and minimally-scooped layer 150B on top of layer 150A.

It is noted that specific combinations of any of the disclosed parameters and specific parameter values may be selected with respect to requirements related to the specific pastes used and pre-defined layer structure of stacks 150. The parameters and their values may be optimized in pre-production steps of the respective process development.

In contrast to current screen-printing methods, the disclosed methods and systems are used to print ultra-fine metal paste lines on silicon wafers in PV cells, printed electronics, VLSI (very large-scale integration) packaging, etc.—utilizing the advantages of PTP methods of non-contact two process steps printing which separates paste filling stage 140 from pattern transfer stage 250. Multi-layered fingers as elements 160 enable printing multi-material elements 160. Advantageously, in disclosed methods and systems all the layers are formed within the same trenches so they are self-aligned; and as both steps of filling and printing are carried out in the same PTP system with the same cycle time as in case of single layer printing—disclosed printing of multi-layered features becomes cost-effective and enables a very high throughput.

For example, disclosed methods and systems may be used to print silver stack fingers 160 for PV cells, which enable further reduction of feature width (e.g., to reduce shading losses of the PV cells) while maintaining or even improving conductivity, e.g., (i) not increasing or even decreasing contact resistance (to the silicon substrate) by using bottom layer 160B made of a paste composition that is optimized for forming the best electrical contact and good adhesion to silicon substrate (e.g., through the silicon nitride layer in TOPCon (tunnel oxide passivated contact or varieties thereof), PERC, (passivated emitter rear contact) etc. PV cells), e.g., by increased concentration of glass frits and/or (ii) not increasing or even decreasing linear resistance (along the finger length) by using top layer 160A made of a paste composition that is optimized for conductivity along the finger, irrespective of the prior art constraint of having to maintain low surface resistance. Hence, printing elements 160 with one material 160B interfacing substrate 70 and optimized therefor, and with another material 160A providing the design's structural and electrical requirements and optimized therefor—enables further narrowing of the printed features while possibly even enhancing their performance such as cell efficiency.

In another example, disclosed methods and systems may be used to print self-aligned selective emitter (SE) lines, which is presently a major challenge of the PV industry. Specifically, as currently SE lines in silicon substrate are created in a separate process, before the finger metallization, accurate alignment between the printed fingers and the SE lines is required. Current solutions involve printing much wider SE lines (e.g., 100 μm wide) to be covered by much narrower metal fingers (e.g., 30 μm wide)—resulting in additional losses of efficiency in short wavelength spectral range. In contrast, disclosed methods and systems may be used to print SE lines by using bottom layer 160B that includes the impurities needed for forming the SE lines and using top layer 160A made of the paste composition that is required for finger metallization—making the present two-step printing process into a one-step printing process and providing the narrowest possible SE lines that exactly fit the metal fingers on top of the SE lines. Consecutively, during the firing process (high temperature heat treatment), all three of the SE lines, the contact to the SE lines and the metal fingers (undergoing silver sintering) are created simultaneously. This application may be applicable, e.g., for PV cells having front metallization over silicon nitride layer, such as TOPCon, PERC and the like Feasibility of such process was reported in the prior art (e.g., Rohatgi et al. 2001, Self-aligned self-doping selective emitter for screen printed silicon solar cells, presented at the 17th European Photovoltaic Solar Energy Conference and Exhibition; Munich, Germany; Oct. 22-26, 2001), however screen printing does not enable forming multi-layer features in one printing process.

In yet another example, disclosed methods and systems may be used to print copper metal fingers instead of silver metal fingers, e.g., for PV cells. While copper is basically preferable to silver as metal finger material due to cost and availability considerations, currently using copper requires forming a barrier and/or seed layer (e.g., using a costly sputtering process) below the copper (e.g., using an electroplating process) to avoid diffusion of copper atoms into silicon substrate 70—resulting in an expensive and complex production process. In contrast, disclosed methods and systems may be used to print bottom layer 160B made of a paste composition for providing a barrier layer (e.g., made of any of silver, nickel, titanium, tantalum, etc., combinations and/or alloys thereof) and top layer 160A made of a copper paste composition. Hence, printing elements 160 with very thin barrier layer 160B interfacing substrate 70 and relatively thick copper layer 160A enables using copper fingers in a single printing step—providing significant improvement over the prior art practices. In certain embodiments, layer 160B may comprise a seed layer, used e.g., for electroplating of a main conductive layer, e.g., made of copper. In certain embodiments, as illustrated e.g., in FIG. 2B, multi-layer stack 150 may comprise barrier layer 150C (contacting substrate 70 as layer 160C of deposited line 160), seed layer 150B (deposited as layer 160B on top of layer 160C) and main conductive layer 150A on top thereof (deposited as layer 160A on top of layer 160B)—forming corresponding line 160 on receiving substrate 70.

FIG. 2B schematically illustrates multi-layered stacks 150 with more than two layers—for printing multi-layered features 160 with more than two layers. The thickness of each layer 150A, 150B, 150C (in the non-limiting case of three layers) may be controlled by any of the pressure apply by blades 145, the angle of blades 145, the velocity of blades 145 and/or the material blades 145 are made of. Specifically, the thickness of each applied layer (e.g., H1 for layer 150A and H3 for layer 150B) decreases with higher blade pressure, with larger blade angle, with higher blade velocity and with softer blade material—leaving more volume to be filled by consecutive layer 150B over layer 150A (denoted schematically H2) and by consecutive layer 150C over layer 150B (denoted schematically H4). As illustrated schematically in FIGS. 1 and 2A, the transfer of multi-layered stack lines 150 onto substrate 70 is carried out by illumination applied to the back of sheet 100, placed directly above and in close proximity to substrate 70.

Figure 2C:
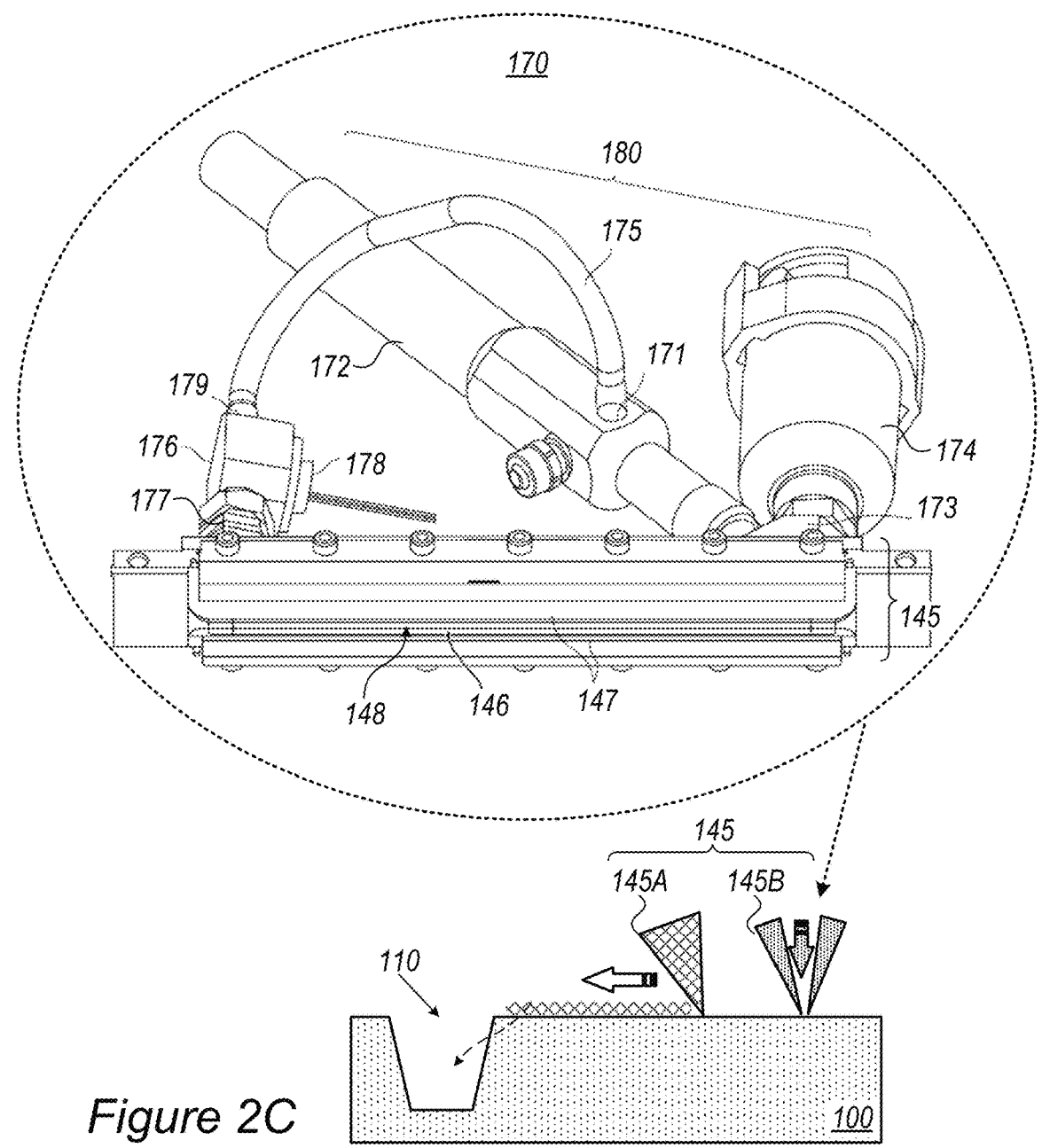
FIG. 2C is a high-level schematic illustration of a combination of paste filling heads including doctor blade dispensing and recirculating paste dispensing, according to some embodiments of the invention.

FIG. 2C is a high-level schematic illustration of a combination of paste filling heads 145 including doctor blade dispensing 145A and recirculating paste dispensing 145B, according to some embodiments of the invention. The example is schematic, and various combinations of one or more doctor blade dispensing heads 145A and/or recirculating paste dispensing heads 145B may be used to fill the paste layers 150A, 150B, etc. into trenches 110. For example, recirculating paste dispensing heads 145B may be used to fill the top paste layer, without scooping.

Paste dispensing apparatus 170 comprises a printing head 145 comprising at least two feeding openings (at the regions of junctions 177, 173), an internal cavity 148 and at least one dispensing opening 146 that are in fluid communication (see, e.g., Chinese Patent Applications Nos. 202110673006.5 and 202121350578.1, incorporated herein by reference in their entirety) and a pressurized paste supply unit 180 configured to circulate paste through printing head 145. The pressure in the pressurized paste supply unit 180 may be adjusted to maintain continuous circulation of the paste through the feeding openings and internal cavity 148, and to control dispensing of the paste through dispensing opening(s) 146. For example, pressurized paste supply unit 180 may comprise a pressurized paste reservoir 174 and a paste pump 172 in fluid communication with internal cavity 148 of printing head 145, which are configured to circulate the paste therethrough. In non-limiting examples, paste pump 172 may comprise rotating pressure-tight displacement systems with self-sealing, rotor/stator designs for dispensing precise volumes such as eco-PEN450™ from Dymax™.

It is noted that printing heads 145 may comprise one or more doctor blade dispensing head(s) 145A and/or one or more recirculating paste dispensing head(s) 145B. For example, one, two or more of printing heads 145A, 145B, 145C (see, e.g., FIGS. 1, 2A, 2B) may comprise recirculating paste dispensing head(s) such as paste dispensing apparatus 170 illustrated schematically in FIG. 2C. Alternatively or complementarily, one, two or more of printing heads 145A, 145B, 145C may comprise doctor blade dispensing head(s) or other types of dispensing heads.

In various embodiments, paste dispensing apparatus 170 comprises at least one pressure sensor 178 configured to measure the pressure of the circulating paste, at one or more positions in pressurized paste supply unit 180. Paste dispensing apparatus 170 may further comprise at least one controller (not shown) configured to adjust the pressure in pressurized paste supply unit 180 (or its components) with respect to the measured pressure of the circulating paste. Paste dispensing apparatus 170 may further comprise one or more paste mixer(s) 176 configured to mix the circulating paste. For example, paste mixer(s) 176 may be a static mixer, mixing the paste by utilizing its pressurization. In non-limiting examples, paste mixer(s) 176 may comprise plastic disposable static mixers such as GXF-10-2-ME™ from Stamixco™ made of large diameter plastic housing that includes multiple mixing elements.

Pressurized paste supply unit 180 may be further configured to introduce the paste into internal cavity 148 via at least one entry opening and to receive the circulated paste via at least one exit opening in printing head 145. Typically, the entry opening(s) and the exit opening(s) are at the top of printing head 145, opposite to dispensing opening(s) 146 which faces the substrate onto which the paste is deposited. Alternatively or complementarily, the entry opening(s) and/or the exit opening(s) may be positioned on sides and/or extension(s) of printing head 145.

Pressurized paste supply unit 180 may comprise pressure-controlled paste reservoir 174, paste pump 172 and mixer 176 that are in fluid communication. Pressure-controlled paste reservoir 174 may be configured to deliver paste to paste pump 172, which may be configured to deliver the paste through mixer 176 to the entry opening(s). Pressurized paste supply unit 180 may be further configured to mix paste from the exit opening(s) with the paste delivered from pressure-controlled paste reservoir 174 to paste pump 172. The exit of the pressure-controlled paste reservoir 174 is in fluid communication with the entry of the paste pump 172. For example, paste in paste reservoir 174 may be delivered to paste pump 172, mixing with paste exiting from the exit opening(s) of printing head 145, to be pumped by paste pump 172 into mixer 176. Paste from mixer 176 may be delivered to the entry opening(s) of printing head 145, wherein the paste moves along internal cavity 148 and some paste may be dispensed through dispensing opening(s) 146 to fill trenches 110. The remaining paste may then be mixed with paste from paste reservoir 174 (e.g., delivered through nozzle(s) at junction 173) to compensate for the dispensed amount, and the paste is circulated through paste dispensing apparatus 170 to maintain its mechanical characteristics and support continued mixing of the paste to maintain its chemical composition. In certain embodiments, paste dispensing apparatus 170 may be further configured to modify paste composition, e.g., by adding additives such as solvents to keep the paste homogenized, possibly in relation to the monitored pressures throughout paste dispensing apparatus 170. For example, additives such as solvents may be added to the paste entering mixer 176 if needed.

In various embodiments, pressure-controlled paste reservoir 174 and paste pump 172 may open adjacently to the exit opening(s) of printing head 145 and paste dispensing apparatus 170 may comprise a conduit 175 connecting the exit of mixer 176 to the entry opening(s) of printing head 145. In some embodiments, pressure-controlled paste reservoir 174 and paste pump 172 may open adjacently to the exit opening(s) of printing head 145, mixer 176 may be adjacent to the entry opening(s) of printing head 145, and conduit 175 may connect paste pump 172 to mixer 176. The dimensions and orientations of paste reservoir 174 and paste pump 172 may vary, e.g., both paste reservoir 174 and paste pump 172 may be set perpendicularly to printing head 145, or one or both of paste reservoir 174 and paste pump 172 may be set at an angle to printing head 145. For example, paste pump 172 may be set obliquely to spread its weight more evenly over printing head 145. In various embodiments, conduit 175 may be adjusted to conform to any arrangement of paste reservoir 174, paste pump 172 and mixer 176, so as to make paste dispensing apparatus 170 more compact or adjust it to a given space and weight distribution requirements within the printing machine.

In various embodiments, printing head 145, internal cavity 148 and dispensing slit 146 limited by slit edges 147 (e.g., metallic slit lips 147) may be elongated and configured with respect to paste properties (e.g., viscosity values), specified throughput and specified features (e.g., length, width and optionally cross section) of the lines or other elements that are to be dispensed by printing head 145. In certain embodiments, dispensing opening 146 may comprise one or more slits, one or more opening, a plurality of linearly-arranged openings, e.g., one or more lines of circular or elliptical openings, and so forth.

Figure 2D:
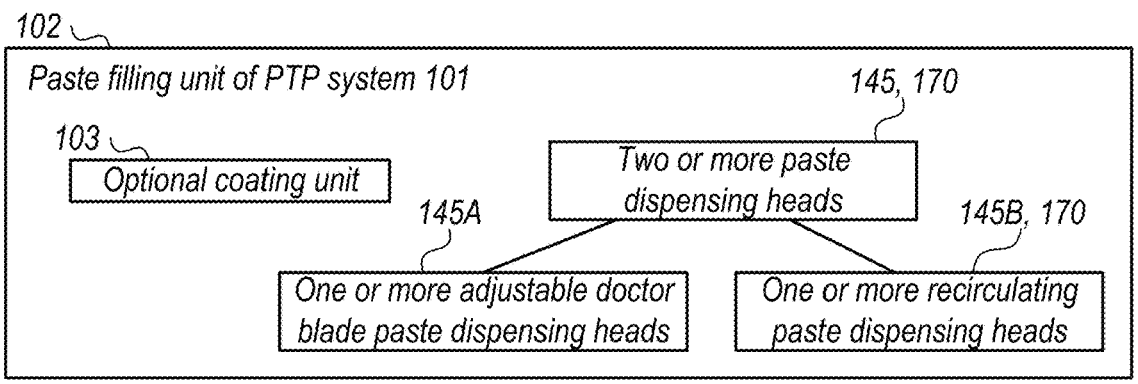
FIG. 2D is a high-level schematic illustration of a combination of a paste filling unit in a pattern transfer printing (PTP) system, according to some embodiments of the invention.

FIG. 2D is a high-level schematic illustration of a combination of a paste filling unit 102 in a pattern transfer printing (PTP) system 101 (see also FIG. 5B), according to some embodiments of the invention. Paste filling unit 102 is configured to fill patterned trenches 110 on delivered pattern transfer sheets 100 with conductive printing paste, utilizing two or more paste dispensing heads 145 which are applied consecutively to fill trenches 110 with stack 150 made of layers 150A, 150B, etc., that is transferred as stack line 150 by PTP system 101 onto receiving substrate 70 using the single illumination step to form multi-layered feature 160 as described herein.

Two or more paste dispensing heads 145 may comprise respective blades 145A, 145B, etc., one for filling each of layers 150A, 150B, etc., with at least one of paste dispensing heads 145 being adjustable with respect to the pressure, the blade angle, the blade velocity and/or the blade flexibility as described herein—to adjust the thickness of the respective layers. At least one of paste dispensing heads 145 may be a recirculating paste dispensing head such as paste dispensing apparatus 170 with pressurized paste supply unit 180, used, e.g., to fill the top layer of stack 150. Paste filling unit 102 may further comprise a coating unit 103 (illustrated schematically, see Chinese Patent Application No. 202111233805.7, incorporated herein by reference in its entirety—for more details) configured to coat trenches 110 with a releasing layer (see FIGS. 5A, 5B) before filling the multi-layered printing paste into trenches 110.

Figure 3A:
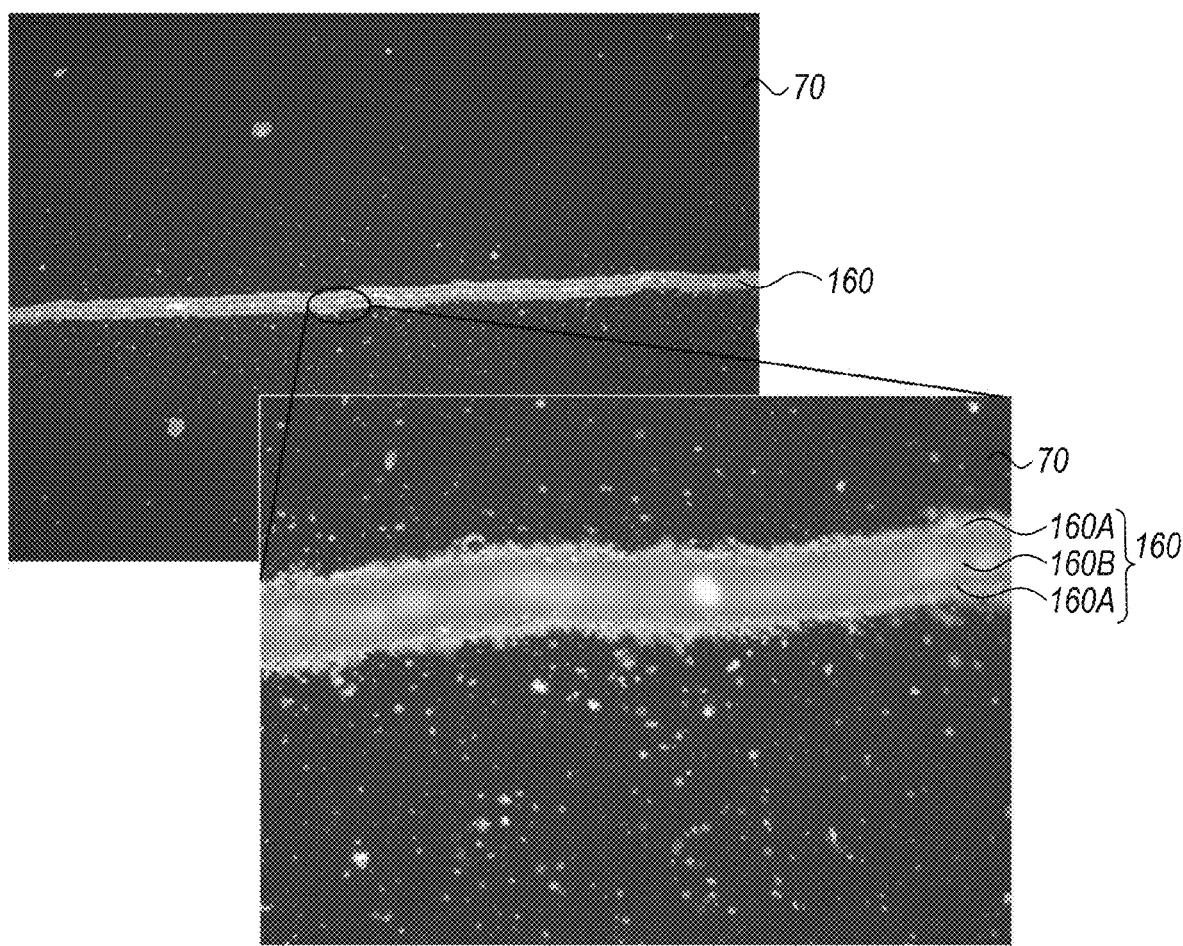
FIG. 3A provides an example for a multi-layered element produced by disclosed methods and systems, according to some embodiments of the invention.

FIG. 3A provides an example for multi-layered element 160 produced by disclosed methods and systems, according to some embodiments of the invention. The illustrated example shows a feature made of 12 μm copper paste 160A on top of 2 μm silver paste 160B (the image is focused on the Ag/Cu boundary to emphasize its multi-layered structure). The feature was prepared by first filling into trench 110 copper paste as material 150A using blade 145A at $\alpha=30°$ and P=2.5 bar and consecutively filling silver paste as material 150B using blade 145B at $\alpha=30°$ and P=2 bar—and transferring the multi-layered paste from filled trench 115 onto substrate 70 (a silicon wafer) to yield the depicted line.

Figure 3B:
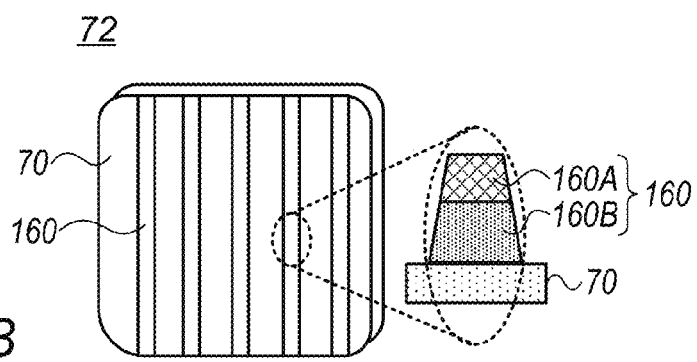
FIGS. 3B and 3C are high-level schematic illustrations of photovoltaic solar cells with multilayered conducting lines, according to some embodiments of the invention.
Figure 3C:
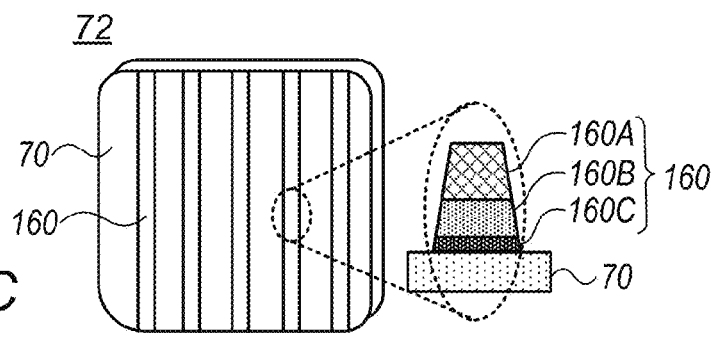

FIGS. 3B and 3C are high-level schematic illustrations of photovoltaic solar cells 72 with multilayered conducting lines 160, according to some embodiments of the invention. In various embodiments, solar cells 72 may comprise multilayered conducting lines 160 produced in a single transfer (illumination) step by pattern transfer method disclosed herein, e.g., using disclosed pattern transfer sheets 100. For example, one or more multilayered conducting lines 160 may be used in photovoltaic solar cells 72 conductive line(s) used to deliver electricity produced by photovoltaic solar cells 72 by conversion of light, e.g., with receiving substrate 70 comprising any type of light-converting material such as semiconducting material (e.g., various types of mono- or poly-crystalline silicon, various thin film materials, configured as single or multi junction cells) or used in any other photovoltaic technology that utilizes conducting lines.

Multilayered conducting lines 160 may comprise at least two layers 160A, 160B, 160C etc. made of different materials that are transferred as multilayered stack line 150 comprising at least two different types of metal paste 150A, 150B, 150C etc., not respectively, as disclosed herein. Following the single-step transfer, multilayered conducting lines 160 may be processed thermally according to the type(s) of paste used (e.g., fired, cured, sintered, annealed together, etc.) to form the finished lines. As non-limiting examples, silver pastes may be sintered (e.g., dried, heated up to about 800° C. and thereby thermally processed, typically over tens of seconds), silver-epoxy pastes may be cured (e.g., heated up to 200°–300° C. and thereby thermally cross-linked, typically over tens of minutes), copper nanoparticle pastes may be sintered at relatively low temperature, and so forth. The specific parameters of the thermal processing of transferred multilayered stacks B into multilayered conducting lines 160, such as temperature profile, duration and the gas atmosphere may be adjusted with respect to the metal paste components in the stack.

In certain embodiments, multilayered conducting line(s) 160 may comprise bottom layer (e.g., denoted 160B in FIG. 3B, 160C in FIG. 3C) comprising a material configured to bind (mechanically and/or electrically) transferred stack line 160 to receiving substrate 70, and at least one top layer (e.g., denoted 160A in FIG. 3B, 160A, 160B in FIG. 3C) comprising a material configured to provide conductivity along transferred stack line 160. For example, the bottom layer may comprise a paste composition that is optimized for forming the best electrical contact and to provide good adhesion to silicon substrate, e.g., having increased concentration of glass frits and/or optionally decreased linear resistance (along the finger length), which is compensated for by the higher linear conductivity of the top layer.

In certain embodiments, multilayered conducting line(s) 160 may comprise bottom layer (e.g., denoted 160B in FIG. 3B, 160C in FIG. 3C) comprising a material configured to form selective emitter (SE) lines 160 on receiving substrate 70, and at least one top layer (e.g., denoted 160A in FIG. 3B, 160A, 160B in FIG. 3C) comprising a material configured to provide conductivity along transferred stack line 160 and electrical contact to receiving substrate 70. For example, the bottom layer may comprise a paste composition that provides the impurities needed for forming the SE lines and compensating for possible reduced conductivity thereof by the higher linear conductivity of the top layer—allowing the production of much thinner SE lines as they are transferred using a single PTP step.

In certain embodiments, multilayered conducting line(s) 160 may comprise bottom layer (e.g., denoted 160B in FIG. 3B, 160C and optionally 160B in FIG. 3C) comprising a material configured to provide a barrier and/or seed layer upon receiving substrate 70, and at least one top layer (e.g., denoted 160A in FIG. 3B, 160A in FIG. 3C) comprising a material configured to provide conductivity along transferred stack line 160. For example, the bottom layer may comprise paste of, e.g., silver, nickel, titanium, tantalum, etc., combinations and/or alloys thereof) as a barrier/seed layer, with the top layer comprising a copper paste that provides high linear conductivity at reduced material costs. Barrier/seed layer(s) may comprise one, two or more layers, as illustrated e.g., schematically in FIG. 3C (with top layer 160A comprising copper).

In various embodiments, photovoltaic solar cells 72 may comprise combinations of multilayered conducting lines 160 disclosed herein.

FIGS. 4A and 4B are high-level flowchart illustrating pattern transfer methods 200, according to some embodiments of the invention. The method stages may be carried out using pattern transfer sheet(s) 100 and/or with respect to corresponding PTP systems, which may optionally be configured to implement method 200.

Method 200 comprises filling with printing paste a plurality of trenches that are arranged in a pattern on a source substrate (stage 210), wherein the printing paste comprises a stacked plurality of layers and the filling is carried out layer-by-layer, and releasing the printing paste from the trenches onto a receiving substrate through illumination by a laser beam-transferring the whole stack line of multi-layered printing paste onto the receiving substrate using a single illumination step (stage 220).

Filling 210 may be carried out by filling the trenches with different pastes of different thickness until full filling of the trenches in the source substrate (stage 212). For example, filling 210 may be carried out by a plurality of blades, one for each layer, and the pattern transfer method further comprising adjusting a thickness of at least one of the layers by adjusting at least one of: a pressure applied to the respective blade, a blade angle of the respective blade, a blade velocity of the respective blade, and/or a flexibility of the respective blade. For example, the pressure may be selected within 2-4 bar, the blade angle may be selected within 30°-120°, the blade velocity may be selected within 25-100 mm/sec and/or a blade material is selected from stainless steel, plastic and rubber.

In some embodiments, at least two of the layers comprise different material compositions and/or different materials, e.g., selected from: (i) a bottom layer comprising a material configured to bind, mechanically and/or electrically, the transferred stack line to the receiving substrate and at least one top layer comprising a material configured to provide conductivity along the transferred stack line, (ii) a bottom layer comprising a material configured to form selective emitter (SE) lines on the receiving substrate, and at least one top layer to provide conductivity along the transferred stack line and electrical contact to the receiving substrate, and/or (iii) a bottom layer comprising a material configured to provide a barrier and/or seed layer upon the receiving substrate and at least one top layer comprising a material configured to provide conductivity along the transferred stack line. In certain embodiments, the bottom layer may comprise a releasing material composition, e.g., as disclosed below.

Method 200 may further optionally comprise applying a releasing layer to facilitate full stack printing (stage 225), illustrated in more detail in FIG. 4B and comprising, for example, (i) prior to the filling, coating the trenches internally with a releasing layer material and drying the releasing layer material to form a solid coating of the trenches configured to disintegrate upon illumination—to facilitate release of the stack line of paste layers filled within the coated trenches (stage 230), optionally, cleaning a surface of the pattern transfer sheet between the trenches from coating residues (stage 232); and (ii) after printing, cleaning the receiving substrate by removing disintegration products of the coating therefrom (stage 240).

Advantageously, disclosed methods and systems, based on non-contact paste transfer, enable printing multi-layered elements, in contrast e.g., to prior art methods such as screen printing (SP) which is a cost-effective production method for printing single layers of high viscosity pastes on different substrates by paste filling of the screen and printing features on a receiving substrate carried out simultaneously. However, as screen printing is a contact technology, printing multi-layered features requires to transfer a substrate with the first (still wet) layer to a dryer and then to the same or another printer with an additional alignment of the second layer to the previous layer. The accuracy of such alignment is limited (mainly because two different screens are not identical and deviate differently with time), the process is much more costly and it is hardly possible to print very fine multi-layer features using prior art SP.

Figures 5A, 5B:
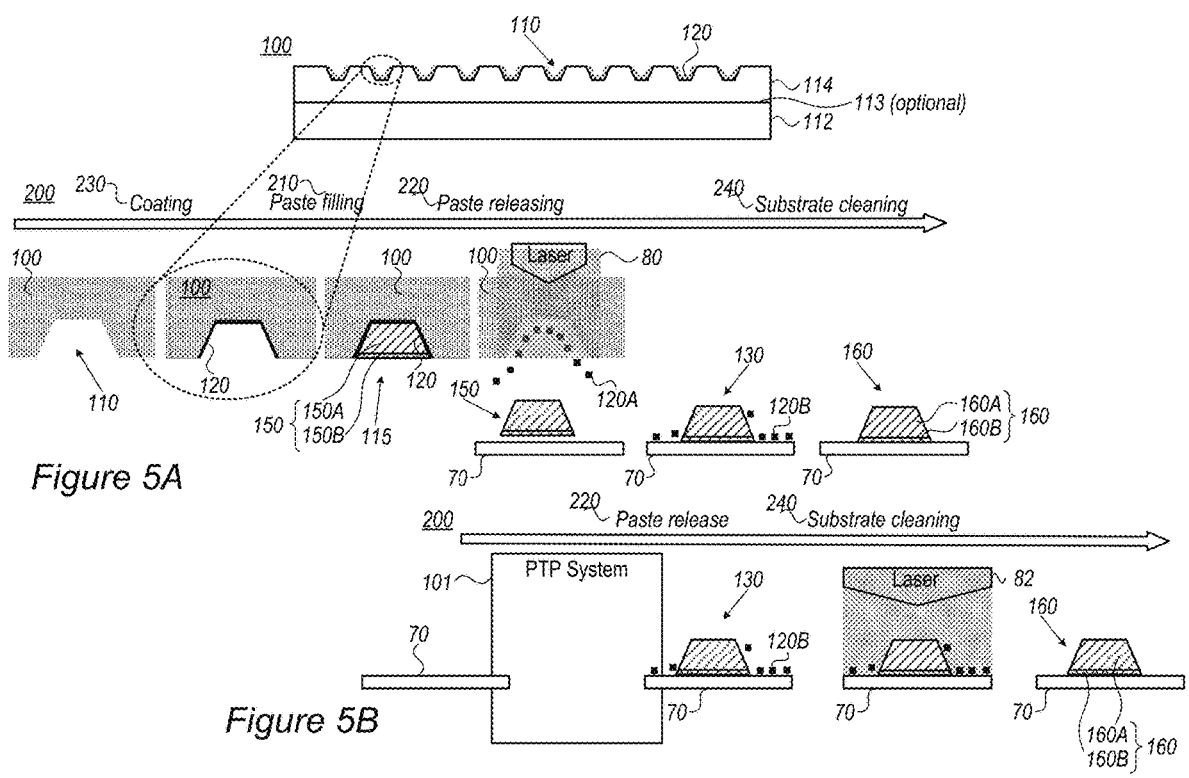
FIGS. 5A and 5B are high-level schematic side-view illustrations of a pattern transfer process for producing multi-layered features and utilizing a releasing layer, according to some embodiments of the invention.

FIGS. 5A and 5B are high-level schematic side-view illustrations of a pattern transfer process for producing multi-layered features and utilizing a releasing layer 120, according to some embodiments of the invention. Trenches 110 in sheet 100 (as source substrate) may be coated internally by coating 120 configured to disintegrate upon illumination 80, to enhance the releasing of multi-layered paste stack 150. Coated trenches that are filled with multi-layered paste are denoted schematically by the numeral 115.

During the releasing of multi-layered paste stack line 150, coating 120 may disintegrate (indicated schematically by numeral 120A) and be deposited on wafer 70 (as receiving substrate) together with released multi-layered paste stack line 150. As a result, wafer 70 may comprise the released multi-layered paste stack line (denoted schematically by numeral 150A) and residues (and/or disintegration products) of coating (denoted schematically by numeral 120B)—an intermediate state denoted by numeral 130. Following the pattern transfer process (by PTP system 101), coating residues 120B may be removed from wafer 70, e.g., by high temperature treatment (e.g., sintering or drying), which is usually applied for sintering printed metal paste in PV cells manufacturing, or by using an illumination 82 to modify and/or remove the residues—to clean the receiving substrate and yield wafer 70 with released paste and without coating disintegration products and residues. Illumination 82 may be same as, similar to or different from illumination 80. In various embodiments, any of the following methods may be used to remove residues 120B of the releasing material: high temperature decomposition (e.g., firing), selective laser vaporization, vacuum-assisted vaporization, air blowing and/or solvent wet washing.

Coating 120, also termed releasing layer 120 for its function, may be a thin layer (e.g., be 1-10 μm thick) deposited on pattern transfer sheet 100 as a source substrate or at least into trenches 110 thereof. In some cases, the material(s) of releasing layer 120 (denoted—the releasing material(s)) may be mixed with any of the components of the multilayered paste prior to filling the layers into trenches 110. Non-limiting examples for releasing materials include acetone-based ClearWeld™ LD920 series and acrylic resins such as Spectra 390™ by Epolin.

For example, coating 120 may be carried out by spreading a coating solution (for example having a solid content between 10% and 20%, or 12%, 14%, 16%, 18%) (e.g., using blade(s), rolls, dies, etc.) and drying the releasing layer to form a solid layer of the trenches, e.g., which may range in thickness between 1 μm and 10 μm (for example 3 μm, 5 μm, 7 μm, 9 μm). If required, the surface of pattern transfer sheet 100 between trenches 110 from coating residues, e.g., using scraping blade(s) and/or sticky rollers Coating 120 may comprise organic materials such as NIR absorbing dyes. At least one of the materials for coating 120 is selected to absorb laser illumination 80 used in the PTP process (e.g., laser with a wavelength of 1064 nm, 1070 nm or any other wavelength in the NIR spectral range). One or more of the materials may be selected to have a maximal absorption at the illumination wavelength. The releasing material(s) may be configured to change phase, evaporate and/or be ablated upon absorption of the laser illumination energy—to yield a thrusting force that pushes multi-layered paste stack line 150 out of trenches 110 (without changing the shape of the paste) and releases multi-layered paste stack line 150 onto receiving substrate 70. For example, for using Nd:Yag laser (1060-1085 nm) for illumination 80, coating 120 may comprise NIR (near infrared) absorbing dyes.

Coating 120 may be used to replace or augment the use of volatile components of the paste (e.g., added to evaporate upon illumination and release paste multi-layered paste stack 150).

Advantageously, the inventors have found out that using coating 120 enables to print paste pattern on receiving substrate 70 with a much higher aspect ratio, e.g., at least 0.7 and up to 1-2—instead of prior art 0.4-0.5; as well as to print extremely narrow fingers, down to 10 μm wide—instead of prior art above 25-30 μm wide—as illustrated in Chinese Patent Application No. 202111233805.7 filed on Oct. 22, 2021, which is incorporated herein by reference in its entirety. Furthermore, avoiding use of volatile compounds in components of the paste broadens the range of printable pastes and makes the process much less sensitive to drying of the paste within the PTP system. Furthermore, although releasing layer 120 is much thinner than paste, a lower laser power is required to release the paste and therefore printing can be carried out at a higher scanning beam velocity, yielding higher system throughput. Finally, using releasing layer 120 makes the printing process more accurate, avoiding printing quality defects of the printing pattern such as paste debris.

In various embodiments, as disclosed, e.g., in Chinese Patent Application No. 202111233805.7, incorporated herein by reference in its entirety, coating 120, functioning as the releasing layer, may be deposited or applied by any known technique, such as gravure, micro gravure, transfer roll, slot extrusion, reverse comma, Mayer rod, doctor blade or other techniques, applied by corresponding coaters. For example, using doctor blade(s), trenches 110 may be filled with a coating solution while keeping the surfaces between trenches 110 clean. After drying the coating solution, coating 120 is formed within trenches 110 at a thickness determined mainly by the solid content of the coating solution. Enclosed chamber doctor blade (protecting or enclosing the coating solution) may be configured to improve the control of the coating solution and to ensure the cleanliness of the surfaces between the trenches. In another example, the coating solution may be applied to the surface of at least a portion of pattern transfer sheet 100, e.g., using a rod spreading technique, spraying, slot extrusion, etc., and drying to form coating 120 as well as the residues on the surfaces between trenches 110. The residues may be removed by various methods, such as scraping blade(s) (made, e.g., of metal, plastic, rubber, etc.) set at specified angles, sticky rollers, etc.—leaving coating 120 within trenches 110. Removed residues may be recycled. Any of the coating processes may be carried out in stationary mode (with stationary pattern transfer sheet 100 and respective coating elements moving with respect thereto) and/or in continuous mode (with stationary coating elements and pattern transfer sheet 100 moving with respect thereto, e.g., using rolls in a roll-to-roll approach). The coating processes may be carried out in advance, before feeding pattern transfer sheet 100 into PTP system 101, or during their movement in PTP system 101, e.g., just before paste filling of the trenches.

In various embodiments, at least the surfaces of trenches 110 may be treated to enhance or control adhesion of coating 120 thereto, using surface treatment techniques such as plasma (e.g., corona), applying silane additives, etc. Surface treatment may be configured to balance between a required coating adhesion within trenches 110, removal of residues from the surfaces between trenches (if needed) and paste release by coating disintegration, as well as by possible sheet recycling considerations.

In various embodiments, PTP system 101 may be configured to inspect and control any of the multilayer deposition stages and/or the coating and cleaning processes, e.g., at a print quality station controlling the printing quality of the fingers, to keep the processes within predefined process windows.

In various embodiments, coating residues 120B may be removed by any of the following procedures: high temperature decomposition, selective laser vaporization, vacuum assisted vaporization (reducing the boiling point of coating residues 120B), air blowing and/or solvent washing. Using heat-based procedures to remove coating residues 120B, the coating material may be selected to have decomposition and/or boiling temperatures that do not affect deposited finger 160 and receiving substrate 70. For example, coating material may be selected to have decomposition and/or boiling temperatures that are well below the high sintering temperature of the c-Si PV metallization process (~850° C.), or optionally below the curing temperature for cured pastes (e.g., silver epoxy pastes). For example, the decomposition and/or evaporation temperatures of coating residues 120B may be in the range of 200° C.-300° C. In certain embodiments, same laser illumination 80 used to evaporate layer 120 used to release multi-layered paste stack 150 may also be used to evaporate and/or decompose coating residues 120B on wafer 70. It is noted that removing coating residues 120B may be carried out in a single process stage or in two or more process stages, e.g., high temperature decomposition (e.g., by laser illumination 80 and/or in an drying oven or sintering furnace) followed by low temperature washing or blowing.

The following non-limiting examples disclose NIR absorbing dyes for use with Nd:Yag laser illumination. In addition to the NIR absorbing dyes, coating 120 may further comprise solvents, as well as optionally binders, surface agents and/or viscosity modifiers.

Non-limiting examples for components of NIR absorbing dyes include Diimonium ionic complex(es), Dithiolene complex(es) and/or phthalocyanine. The illustrated Diimonium ionic complex may include, e.g., alkyl chain(s) as one or more residue(s) R and counter ions (not shown) such as $2SbF_6$.

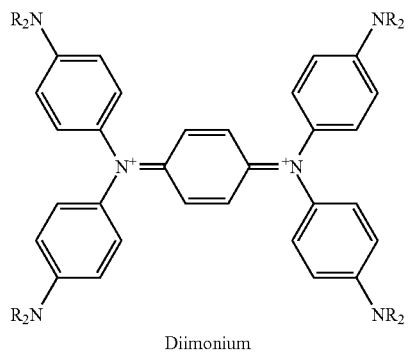

Diimonium

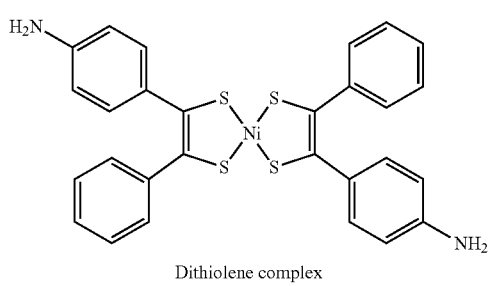

Dithiolene complex

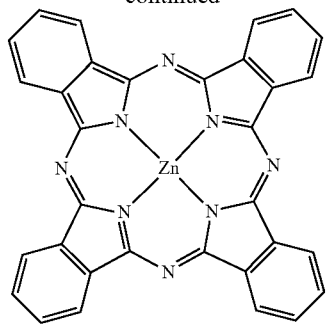

Phthalocyanine

Additional, non-limiting examples for components of NIR absorbing dyes in any of the disclosed embodiments may include any of cyanine (tetramethylindo(di)-carbocyanines) dyes such as, e.g., open chain cyanines ($R_2N'$=CH[CH=CH]$_n$-$NR_2$), hemicyanines (Aryl=$N^+$=CH[CH=CH]$_n$—$NR_2$), closed chain cyanines (Aryl=$N^+$=CH[CH=CH]$_n$—N=Aryl), neutrocyanines ($R2N^+$=CH[CH=CH]$_n$—CN and $R_2N^+$=CH[CH=CH]$_n$—CHO), e.g., with extended [CH=CH]$_n$ chains, or variants or mixtures thereof; phthalocyanine or naphthalocyanine dyes (comprising four isoindole units linked by a ring of nitrogen atoms) or metal complexes thereof (e.g., with aluminum or zinc), dithiolene metal complexes (having one to three dithiolene ligands), e.g., with nickel, squaraine dyes such as squarylium dye III, quinone analogues, diimonium compounds and azo derivatives, and/or any of their variants, derivatives and/or combinations.

Solvent(s) included in the coating formulation may be selected to dissolve the dye(s) as well as optional binder(s) and additive(s), and may comprise, e.g., acetone, ketones, alcohols, aromatic hydrocarbons and/or glycol ethers solvents.

The coating formulation may further comprise binder(s) comprising polymers and/or polymer precursors for forming coating 120 as a continuous film in trenches 110, such as, e.g., poly-vinyl butyral, ethyl-cellulose and/or derivatives thereof, as long as the decomposition temperature of binder(s) is below the paste sintering temperature (e.g., 800° C. for silver pastes, or e.g., 850° C., 800° C., 750° C., 700° C., 650° C., 600° C., 550° C., 500° C., 450° C., 400° C., 350° C. for silver pastes or other metal pastes or mixtures thereof) or below the paste curing temperature (e.g., 300° C. for silver epoxy pastes, or e.g., 300° C., 250° C., 200° C. for silver epoxy pastes or other metal pastes). Binder(s) may further be selected to minimize the amount of coating residues 120B and/or to simplify the removal thereof.

The coating formulation may further comprise surface wetting additive(s) selected to stabilize the dispersion of the different coating components and/or viscosity modifier(s) selected to support the application of coating 120 in trenches 110. The additive(s) and/or viscosity modifier(s) are selected to have their decomposition temperature below the paste sintering or curing temperature (depending on the type of the paste) and may further be selected to minimize the amount of coating residues 120B and/or to simplify the removal thereof.

In certain embodiments, the solid content of coating 120 may be between 10 wt % and 20 wt % to enable reaching coating 120 which is 1-10 μm thick within trenches 110 that are 20-30 μm deep.

In certain embodiments, the coating formulation or any of its components, such as the NIR absorbing dyes, may be mixed into layer 150A, which as the inner (bottom) layer and commonly the thickest layer, has the largest contact area with trenches 110 of sheet 100. Mixing releasing material into at least inner layer 150A of multi-layered paste stack 150 may enhance releasing or possible at least partially enable replacing coating 120 (e.g., in certain regions of pattern transfer sheet 100). For example, at least a portion of the release material may be mixed with at least inner layer 150A of paste stack 150 (e.g., as a component of the paste that is deposited as layer 150A or as an additive that is mixed during past deposition) to improve the releasing of multi-layered paste stack line 150. Mixing releasing material into at least the inner (bottom) layer of paste stack 150 may yield print quality improvement. Disclosed releasing material may be added to provide a few percent of the material of the inner layer of multi-layered paste stack 150, e.g., between 1-5% of the inner layer material. In certain embodiments, both coating 120 and the mixing of the releasing material into at least the inner layer paste may be applied.

Accordingly, at least inner layer 150A of multi-layered paste stack 150 may comprise, in addition to commercially available printing pastes (e.g., SOL9651B™ from Heraeus™), NIR absorbing dyes such as Diimonium ionic complex(es), Ditholene complex(es) and/or phthalocyanine as illustrated herein. It is noted that NIR absorbing dyes may be added to silver pastes, to silver epoxy pastes, or to any other material, which is used as the inner layer of the multi-layer stack within the trench.

Certain embodiments comprise a multi-layered paste stack for use in a pattern transfer process (that includes filling the paste into trenches in the pattern transfer sheet which are arranged in a specified pattern, and consecutively releasing the paste from the trenches onto the receiving substrate upon illumination by the laser beam). For example, in case the illumination is in NIR, the paste comprises a releasing material configured to enhance the releasing of the paste from the trenches, with the releasing material comprising at least one NIR absorbing dye comprising at least one of: a Diimonium ionic complex, a Ditholene complex, phthalocyanine, derivatives, salts and/or combinations thereof. Non-limiting examples include dyes from TCI (Tokyo Chemical Industry, Ltd), Epolight™ 1117 (Tetrakis (decyl)ammonium structure) by Epolin and/or Lunir5™ by Luminochem.

Disclosed sheets 100 may be used to print fine lines of thick metallic paste on silicon wafers, e.g., for photovoltaic (PV) cells as well as to produce electronic circuits by creating conductive lines or pads or other features (e.g., on laminates for PCBs) for printed passive electronic components like resistors or capacitors, or for other printed electronic devices. Other applications may comprise creating conductive features in the manufacturing processes of mobile phones antennas, decorative and functional automotive glasses, semiconductor integrated circuits (IC), semiconductor IC packaging connections, printed circuit boards (PCB), PCB components assembly, optical biological, chemical and environment sensors and detectors, radio frequency identification (RFID) antennas, organic light-emitting diode (OLED) displays (passive or active matrix), OLED illuminations sheets, printed batteries and other applications. For example, in non-limiting solar applications, the metallic paste may comprise metal powder(s), optional glass frits and modifier(s), volatile solvent(s) and non-volatile polymer(s) and/or or resin(s). A non-limiting example for the paste includes SOL9651B™ from Heraeus™. The metal pastes may include silver, copper or other metals and/or their combinations and/or alloys. Any of the metal pastes may include any type of electrically conductive adhesive (ECA) pastes.

Filling of the paste into trenches 110 may be carried out by any type of paste-filling head operating within any type of PTP system 101. The filling process may be controlled to assure continuous and uniform filling of the trenches and marks with paste.

In certain embodiments, pattern transfer sheet 100 may be transparent to laser beam 80 and comprise at least a top polymer layer 114 comprising trenches 110 (illustrated in FIGS. 1 and 5A) embossed, press molded, pneumatically molded or laser molded thereon. In the illustrated non-limiting example, trenches 110 are illustrated as being trapezoid in cross section.

Periodical trenches 110 may comprise trenches, recesses and/or indentations that are embossed (e.g., press molded, pneumatically molded or laser molded) in a similar manner into top polymer layer 114, and may have similar or different profiles. For example, trenches 110 may have various profiles (cross section shapes), such as trapezoid, rounded, square, rectangular and/or triangular profiles. In various embodiments, the pattern of trenches 110 on transfer sheet 100 may comprise continuous trenches 110 and/or arrays of separated dents. It is noted that the term "trenches" is not to be construed as limiting the shape of trenches 110 to linear elements, but is understood in a broad sense to include any shape of trenches 110.

Pattern transfer sheet 100 may further comprise a bottom polymer layer 112 having a melting temperature that is higher than an embossing temperature of top polymer layer 114. In a non-limiting example, top polymer layer 114 may have a melting temperature ($T_m$) below 170° C., below 150° C., below 130° C., below 110° C. (or any intermediate range) in case it is made of semi-crystalline polymer, or a glass temperature ($T_g$) below 160° C., below 140° C., below 120° C., below 100° C. (or any intermediate range) in case it is made of amorphous polymer. The melting temperature of bottom polymer layer 112 may be above the melting point of top polymer layer 114, e.g., above 100° C. (e.g., in case top polymer layer 114 is made of polycaprolactone and has $T_m/T_g$ about 70° C.), above 120° C., above 150° C., above 160° C. (e.g., bi-axially-oriented polypropylene) and up to 400° C. (e.g., certain polyimides), or intermediate values.

In various embodiments, polymer layers 112, 114 may be made of at least one of: polyethylene, polypropylene, polyethylene terephthalate, polybutylene terephthalate, polyethylene naphthalate, fully aromatic polyester, other copolymer polyester, polymethyl methacrylate, other copolymer acrylate, polycarbonate, polyamide, polysulfone, polyether sulfone, polyether ketone, polyamideimide, polyether imide, aromatic polyimide, alicyclic polyimide, fluorinated polyimide, cellulose acetate, cellulose nitrate, aromatic polyamide, polyvinyl chloride, polyphenol, polyarylate, polyphenylene sulfide, polyphenylene oxide, polystyrene, or combinations thereof—as long as top polymer layer 114 has a melting or glass transition temperature ($T_m/T_g$) below the melting or glass transition temperature ($T_m/T_g$) of bottom polymer layer 112 and/or as long as bottom polymer layer 112 is not affected by the processing conditions of top polymer layer 114.

In certain embodiments, the bottom polymer layer 112 and the top polymer layer 114 may be each between 10 μm and 100 μm thick, e.g., between 15 μm and 80 μm thick, between 20 μm and 60 μm thick, between 25 μm and 40 μm thick, or within any intermediate range, with bottom polymer layer 112 being at least as thick as top polymer layer 114. The bottom polymer layer 112 and the top polymer layer 114 may be attached by an adhesive layer 113 thinner than 10 μm (e.g., thinner than 8 μm, thinner than 6 μm, thinner than 4 μm, thinner than 2 μm or having any intermediate thickness), that is transparent to laser beam 80. For example, in certain embodiments, top polymer layer 114 may be thicker than the depth of trenches 110 by several μm, e.g., by 5 μm, by 3-7 μm, by 1-9 μm, or by up to 10 μm. For example, trenches 110 may be 20 μm deep, top polymer layer 114 may be between 20-30 μm thick (e.g., 25 μm thick) and bottom polymer layer 112 may range in thickness between 30 μm and 40 μm (it is noted that thicker bottom polymer layers 112 provide better mechanical performances).

The temperature and thickness of top polymer layer 114 and bottom polymer layer 112 may be designed so that top polymer layer 114 has good molding, ductility and certain mechanical strength, while bottom polymer layer 112 has good mechanical strength. Both top polymer layer 114 and bottom polymer layer 112 may be designed to have good bonding properties.

Elements from FIGS. 1-5B may be combined in any operable combination, and the illustration of certain elements in certain figures and not in others merely serves an explanatory purpose and is non-limiting. It is noted that disclosed values may be modified by at least ±10% of the respective values.

Advantageously, while the prior art cannot achieve a printed pattern with features comprising multiple conductive layers, disclosed embodiments meet the performance and production challenges of paste fingers for electronic circuits using a single-stage multi-layered stack printing, which enables to combine different materials within the stack, separating the substrate compatibility requirement and the finger performance requirement from each other, and inherently ensuring alignment between the layers.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A pattern transfer method comprising:
    filling, layer-by-layer, a plurality of stack lines that are each made of a plurality of printing paste layers into a plurality of trenches on a source substrate, wherein the stack lines are filled into corresponding trenches that are arranged in a pattern, and
    releasing-the plurality of stack lines from the corresponding plurality of trenches onto a receiving substrate simultaneously, in a single illumination step by a laser beam, forming transferred stack lines on the receiving substrate,
    wherein at least two of the paste layers comprise different material compositions.

2. The pattern transfer method of claim 1, wherein the filling is carried out by a plurality of blades, one respective blade for each paste layer, and the pattern transfer method further comprising adjusting a thickness of at least one of the paste layers by adjusting at least one of: a pressure applied to the respective blade, a blade angle of the respective blade, a blade velocity of the respective blade, and/or a flexibility of the respective blade.

3. The pattern transfer method of claim 2, wherein the pressure is selected within 2-4 bar, the blade angle is selected within 30°-120°, the blade velocity is selected within 25-100 mm/sec and/or a blade material is selected from stainless steel, plastic and rubber.

4. The pattern transfer method of claim 1, wherein the at least two of the paste layers that comprise the different material compositions yield a configuration on the receiving substrate that is selected from one of:
    a bottom paste layer comprising a material configured to bind the transferred stack lines to the receiving substrate and at least one top paste layer comprising a material configured to provide conductivity along the transferred stack lines,
    a bottom paste layer comprising a material configured to form selective emitter (SE) lines on the receiving substrate, and at least one top paste layer configured to provide conductivity along the transferred stack lines and electrical contact to the receiving substrate, and
    a bottom paste layer comprising a material configured to provide a barrier and/or seed layer upon the receiving substrate and at least one top layer comprising a material configured to provide conductivity along the transferred stack lines.

5. The pattern transfer method of claim 4, wherein the bottom paste layer comprises a releasing material composition.

6. The pattern transfer method of claim 1, further comprising:
    prior to filling the plurality of stack lines, coating the trenches internally with a coating configured to disintegrate upon illumination by the laser beam, to enhance the releasing of the stack lines, and
    optionally after the releasing, cleaning the receiving substrate by removing disintegration products of the coating therefrom.

7. The pattern transfer method of claim 6, wherein the coating is carried out by at least one of:
   spreading a coating solution having a solid content between 10% and 20% and drying thereof, and
   at least one application technique of: gravure, micro gravure, transfer roll, slot extrusion, reverse comma, Mayer rod and/or doctor blade.

8. The pattern transfer method of claim 6, further comprising the cleaning of the receiving substrate, carried out by at least one of: high temperature decomposition, illumination by the illumination source used to release the stack lines, selective laser vaporization, vacuum assisted vaporization, air blowing and/or solvent washing.

* * * * *